(12) United States Patent
Joshi et al.

(10) Patent No.: US 10,043,750 B2
(45) Date of Patent: Aug. 7, 2018

(54) NANOTUBE STRUCTURE BASED METAL DAMASCENE PROCESS

(71) Applicant: Infineon Technologies AG, Neubiberg (DE)

(72) Inventors: Ravi Joshi, Villach (AT); Juergen Steinbrenner, Noetsch (AT)

(73) Assignee: Infineon Technologies AG, Neubiberg (DE)

( * ) Notice: Subject to any disclaimer, the term of this patent is extended or adjusted under 35 U.S.C. 154(b) by 106 days.

(21) Appl. No.: 14/738,967

(22) Filed: Jun. 15, 2015

(65) Prior Publication Data

US 2015/0311157 A1 Oct. 29, 2015

Related U.S. Application Data

(63) Continuation of application No. 14/168,025, filed on Jan. 30, 2014, now Pat. No. 9,159,669.

(51) Int. Cl.
| | |
|---|---|
| H01L 23/528 | (2006.01) |
| H01L 21/02 | (2006.01) |
| H01L 21/768 | (2006.01) |
| H01L 23/532 | (2006.01) |
| H01L 21/285 | (2006.01) |
| H01L 21/311 | (2006.01) |

(52) U.S. Cl.
CPC ...... *H01L 23/528* (2013.01); *H01L 21/02115* (2013.01); *H01L 21/02527* (2013.01); *H01L 21/02606* (2013.01); *H01L 21/28568* (2013.01); *H01L 21/31138* (2013.01); *H01L 21/76801* (2013.01); *H01L 21/76829* (2013.01); *H01L 21/76871* (2013.01); *H01L 21/76877* (2013.01); *H01L 21/76885* (2013.01); *H01L 23/5329* (2013.01); *H01L 23/53209* (2013.01); *H01L 23/53223* (2013.01); *H01L 23/53228* (2013.01); *H01L 23/53266* (2013.01); *H01L 21/02645* (2013.01); *H01L 21/7682* (2013.01); *H01L 2221/1047* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 7,229,909 B2 * | 6/2007 | Furukawa | ............... | B82Y 10/00 257/E21.581 |
| 2004/0169281 A1 * | 9/2004 | Nguyen | ................. | B82Y 10/00 257/758 |

FOREIGN PATENT DOCUMENTS

CN 102417175 A 4/2012

* cited by examiner

*Primary Examiner* — Jack Chen
(74) *Attorney, Agent, or Firm* — Viering, Jentschura & Partner mbB

(57) ABSTRACT

In various embodiments a method for manufacturing a metallization layer on a substrate is provided, wherein the method may include forming a plurality of groups of nanotubes over a substrate, wherein the groups of nanotubes may be arranged such that a portion of the substrate is exposed and forming metal over the exposed portion of the substrate between the plurality of groups of nanotubes.

12 Claims, 4 Drawing Sheets

NANOTUBE STRUCTURE BASED METAL DAMASCENE PROCESS

RELATED APPLICATION(S)

This application is a continuation of U.S. patent application Ser. No. 14/168,025, filed Jan. 30, 2014, the contents of the application is incorporated herein by reference in its entirety for all purposes.

TECHNICAL FIELD

Various embodiments relate to a damascene process based on nanotube structures, for example carbon nanotube (CNT) structures.

BACKGROUND

To overcome the need for better thermal and electrical conductivity in semiconductor manufacturing, metals offering better electrical and thermal conductivity such as copper are increasingly used to replace metals with lower conductivity such as aluminium for power metallization. The major hurdle on this way is the structuring of the power metal in FEOL (front end of line) as well as BEOL (back end of line) processes. Metals such as copper cannot be structured using conventional methods (wet or dry etch) due to unavailability of proper etching agents. Therefore, at present stage, during provision of power metallization, metals are structured by a method called dual Damascene, in which a semiconductor workpiece is patterned with open trenches e.g. formed in an oxide layer which are then filled with a thick layer of metal, typically copper, usually overfilling the trenches, and chemical-mechanical planarization (CMP) is used to remove the excess portions of the metal. In order to do so, thicker photo resist or oxide layers, e.g. in the range of 10 µm or more, are used for the structuring process of the metal. The larger thickness of photo resist and its structuring leads to higher costs and, in addition, technical problems with photolithography and resist strips may arise. Furthermore, when copper structures as thick as 50 µm are needed, that conventional manufacturing process reaches its application limit.

SUMMARY

In various embodiments a method for manufacturing a metallization layer on a substrate is provided, wherein the method may include forming a plurality of groups of nanotubes over a substrate, wherein the groups of nanotubes may be arranged such that a portion of the substrate is exposed and forming metal over the exposed portion of the substrate between the plurality of groups of nanotubes.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
FIGS. 1A to 1H show a method for manufacturing a metallization layer on a substrate according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In various embodiments of the method described herein, nanotubes, for example carbon nanotubes (CNTs) may be used to form open trenches into which a metal, for example copper, may be filled or deposited. In accordance with exemplary embodiments of the method, highly aligned CNTs, also referred to as CNT forest, may be grown directly on the substrate on which the power metallization is to be provided. In accordance with further exemplary embodiments, an agglomeration of already highly aligned CNTs may be grown on a separate substrate and/or in a separate process and be then transferred onto the substrate on which the power metallization is to be provided. The nanotube forest may be structured first and then filled with an electrically insulating material or it may be filled with an electrically insulating material and then structured. In the following, the electrically insulating material will be referred to as insulating material. In both cases, a structured nanotube forest is obtained which includes negative sites, i.e. sites where the nanotubes have been removed thereby defining a pattern of trenches. The negative sites when filled with a metal, e.g. copper, may be used as electrical interconnects between a redistribution layer and devices formed within the substrate. The insulating material may be an oxide (e.g. silicon oxide or titanium oxide) or silicon nitride to name a few examples and, when deposited between the nanotubes, may form structures with an electrical resistance in the range of Megaohms. The depth of the negative sites defined by the height of the nanotubes surrounding those may be adjusted by tuning the growth time of the nanotubes. In the temperature range from approximately 300° C. to approximately 750° C. a vertical growth in the range from approximately 30 µm to approximately 40 µm per minute may be achieved. Therefore, the thickness of the power metal deposited in the negative sites the depth of which is defined by the height of the nanotubes may be tuned over a wide range from a few micrometers up to a few millimeters.

Although CNTs may be seen as the most prominent example of nanotubes, there are numerous other 1D nanomaterials which can be grown in a similar fashion to CNTs to obtain forests of highly aligned nanotubes or nanowires, such as silicon, gallium nitride (GaN), gallium arsenide (GaAs), oxides such as zinc oxide (ZnO), iron oxide (Fe2O3) etc, and may thus be used in various embodiments. However, up to now the growth and the structure of CNTs has been well researched such that CNTs can be grown to a very high aspect ratio of approximately 20:1 or more, thereby enabling their usage for the application as described herein. In this specification the term "highly aligned" as used herein with respect to nanotubes or nanowires which are 1D structures may be understood to mean that a majority of nanotubes or nanowires from a group of nanotubes or nanowires may be substantially oriented in the same direction. For example, nanotubes or nanowires may be highly aligned in the sense that they may be arranged on a surface of a substrate and extend therefrom in substantially the same direction, i.e. substantially at the same angle (inclination angle) with respect to the surface they are arranged on, wherein the inclination angle may be approximately 90° with deviations of up to a few degrees from the vertically upright position still being acceptable. The deviation of the inclination angle from 90° for nanowires or nanotubes other than CNTs (such as ZnO, $SnO_2$, SiNW etc.) may be larger than for CNTs and may be largely dependent on the growth process, substrate orientation etc. The high alignment of a majority of nanotubes/nanowires from a group may facilitate deposition of the insulating material therebetween and serve as a stabilizing matrix for the insulating material. The term "forest" as used herein with respect to nanotubes or nanowires may be understood to mean a dense arrangement of highly aligned nanotubes or nanowires on a surface, wherein the density may lie in the range from approximately $10^{11}$ nanotubes per square centimeter to approximately $10^{13}$ nanotubes per square centimeter.

FIGS. 1A to 1H show a method manufacturing a metallization layer on a substrate according to various embodiments by using a forest of highly aligned nanotubes.

In FIG. 1A a substrate 100 is shown on which a metallization layer is to be provided. The term metallization layer as used herein may be, for example, understood to mean a layer which may be a structured layer which may include a metal a metal stack including a bilayer or a multilayer of different metals or a metal alloy. The substrate 100 may be a semiconductor substrate which has been processed in FEOL. Therefore, the substrate 100 may include individual devices such as transistors, capacitors, resistors, etc. which may be provided in the semiconductor in the form of differently doped regions.

Figure 1B:

FIG. 1B shows the substrate 100 which has been further processed. A first layer 102 which may include aluminium, tantalum or tungsten is provided on the substrate 100. The first layer 102 may have a thickness in the range from approximately a few tens of nanometers to approximately a few micrometers. A second layer 104 which may include iron, cobalt, nickel or any one of the rare earth metals is provided on the first layer 102. The second layer 104 may have a thickness in the range from approximately 0.5 nm to approximately 3 nm. The first layer 102 and the second layer 104 form a catalyst system which enables the growth or attachment of nanotubes, for example CNTs on the substrate 100. In a sense the composite catalyst system including the first layer 102 and the second layer 104 may be seen as a mediating layer in the process of growing or attaching nanotubes/nanowires on or to the surface of the substrate 100. In this exemplary embodiment, the catalyst system includes two layers and is therefore multi-metallic. However, the catalyst system may only include one of the layers shown in FIG. 1B and therefore be mono-metallic. The stack including the first layer 102 and the second layer 104 may be seen as a monolayer and/or multilayer stack of different metals which may support the growth of nanotubes such as CNTs on the surface of the substrate 100 and it may further serve as electrical contact which may enable metal deposition after the nanotube growth process.

Figure 1C:
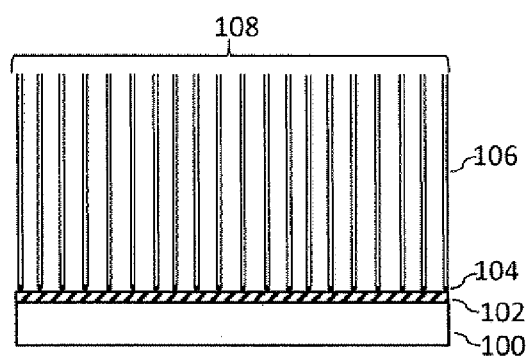

In FIG. 1C, a multitude of nanotubes 106 are provided on the substrate 100 forming a forest of nanotubes 108. The substrate 100 with the catalyst system including the two layers 102, 104 being provided thereon may be heated to temperatures in the range from approximately 300° C. to approximately 750° C. in order to transform the second layer 104 into catalyst nano-particles which serve as seed cells for the subsequent growing of nanotubes. The growth of nanotubes/nanowires, for example CNTs, is a process well known in the state of the art and will not be described within the scope of this specification. Suffice it to say that the nanotubes/nanowires 106 may be grown on the substrate 100 by means of chemical vapour deposition (CVD), for example by ordinary CVD, plasma enhanced CVD (PECVD) or low pressure CVD (LPCVD). Within the scope of this specification the terms nanotubes and nanowires may be used interchangeably as they may be seen to be equivalent in the sense that both are substantially one-dimensional structures with very high aspect ratios which may be provided on surfaces in arbitrary patterns.

Alternatively, the nanotubes 106 may be grown in a separate process on a separate substrate and be than transferred onto the substrate 100. In that case, an undercoating or an adhesion promoting layer for attaching the nanotubes to the substrate 100 instead of the catalyst system may be deposited on the substrate 100 which may include soldering paste, silver paste or a tin alloy. This alternative way of manufacturing the nanotubes 106 separately from the substrate 100 may be favourable if, for some reason for example, the substrate 100 may not be exposed to temperature ranges required for the growing process of the nanotubes.

Figure 1D:
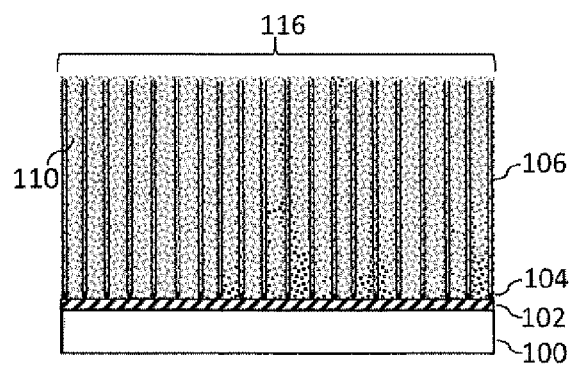

In FIG. 1D the substrate 100 after a further process stage of the manufacturing of a metallization layer on a substrate is shown. After the forest of nanotubes 108 has been provided on the substrate 100 either by growth thereon or by transfer of readily grown nanotubes thereto, an insulating material 110 may be deposited on the forest of nanotubes 108. The insulating material 110 may include any oxide (e.g. silicon oxide or titanium oxide) or silicon nitride to name a few examples. During the deposition of the insulating material 110 it may settle between the individual nanotubes 106 and may fill the space within the forest of nanotubes 108 from the surface of the substrate 100 (e.g. the top surface of the first layer 102 or a corresponding undercoating layer) at least to a plane defined by the free standing end tips of the nanotubes 106. The nanotubes 106 which are covered in the insulating material 110 form an insulator-nanotube composite 116.

Figure 1E:
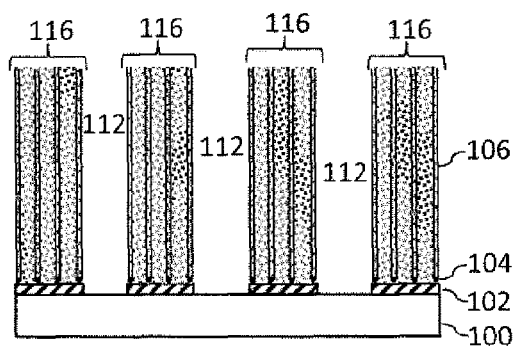

FIG. 1E shows the substrate 100 with the insulator-nanotube composite 116 which has been structured into several portions or segments. That is, the insulator-nanotube composite 116 from FIG. 1D has been patterned to reveal void sites, i.e. sites where nanotubes 106 together with the insulating material 110 in their immediate vicinity have been removed such that trenches 112 (or gaps) are formed. In other words, a plurality of groups 116 of nanotubes containing insulating material 110 therebetween are formed from the insulator-nanotube composite 116 provided over the substrate 100, wherein the plurality of groups 116 of nanotubes are arranged such that portions of the substrate 100 become exposed thereby defining the trenches 116 or negative voids. The unpatterned nanotube forest 108 containing the insulator material 110, i.e. the insulator-nanotube composite 116, may be etched by means of a proper mask disposed on top of the insulator-nanotube composite 116, for example by plasma etching. In other words, nanotubes 106 and the insulating material 110 immediately surrounding those may be removed from the insulator-nanotube composite 116 such that the upper surface of the substrate 100 is exposed. The depth of the thus created trenches 112 may be defined by the height of the nanotubes 106 forming the forest of nanotubes 108. Compared with the remaining nanotubes 106, the trenches may be seen to form negative voids within the insulator-nanotube composite 116.

Figure 1F:
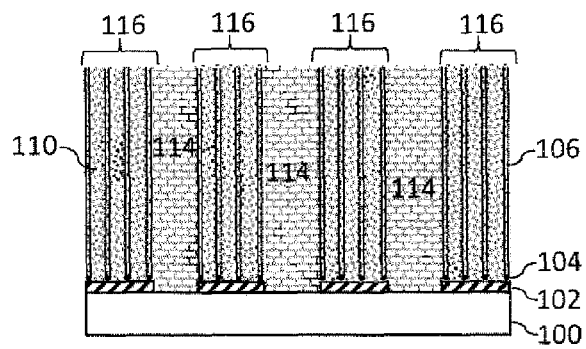

FIG. 1F shows the structure from FIG. 1D after a metal 114 has been filled into the negative voids 112, i.e. between portions of the insulator-nanotube composite 116. The metal 114, for example copper, may be filled into the trenches 112 by means of electrochemical deposition (ECD).

Figure 1G:
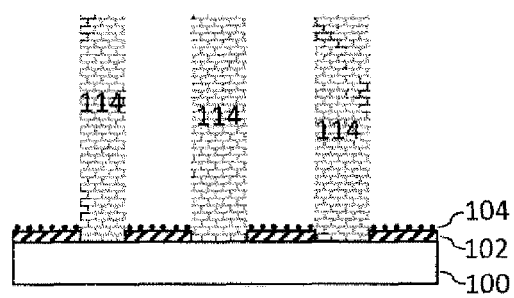

FIG. 1G shows the structure from FIG. 1F after the insulator-nanotube composite portions 116 have been removed, for example by means of a dry etch using oxygen plasma. However, in alternative embodiments the insulator-nanotube composite portions 116 may remain in place as insulating pillars between the portions of metal 114 provided within the trenches 112 in cases where a short circuit caused by the first layer 102 and/or the second layer 104 provided under the insulator-nanotube composite portion 116 between two corresponding portions of metal 114 would not render the corresponding device inoperable, such as in cases where two or more portions of metal 114 form or belong to one common source/drain contact.

Figure 1H:
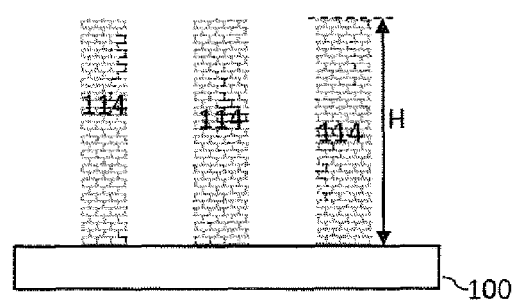

In FIG. 1H the structure from FIG. 1G is shown after the catalyst system which is provided underneath the removed portions of the insulator-nanotube composite 116 has been removed to avoid the risk of short circuits between the adjacent portions of metal 114 formed in the formerly present trenches 112.

An alternative embodiment of the method for manufacturing a metallization layer on a substrate by using a forest of highly aligned nanotubes is shown in FIGS. 2A to 2D. As the alternative embodiment to be described is similar to the one already described with reference to FIGS. 1A to 1H, the same reference numbers will be used for the same elements and they will not be described again.

Figure 2A:
FIGS. 2A to 2D show a method for manufacturing a metallization layer on a substrate according to various further embodiments.

As shown in FIG. 2A, the manufacturing method starts with a substrate 100 which may correspond to the substrate shown in FIG. 1A.

Figure 2B:
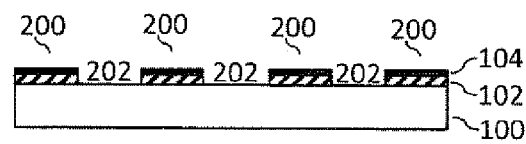

In FIG. 2B the substrate 100 is shown to be covered with the catalyst system including the first layer 102 and the second layer 104, however, in a structured manner. To be more precise, here the catalyst system is provided in the form of discrete catalyst system portions 200 which are interspaced by gaps 202 where the catalyst system has been removed such that the surface of the substrate 100 is exposed. The patterned form of the catalyst system may be obtained from the structure as shown in FIG. 1B by etching the first layer 102 and the second layer 104 in a corresponding pattern.

Figure 2C:
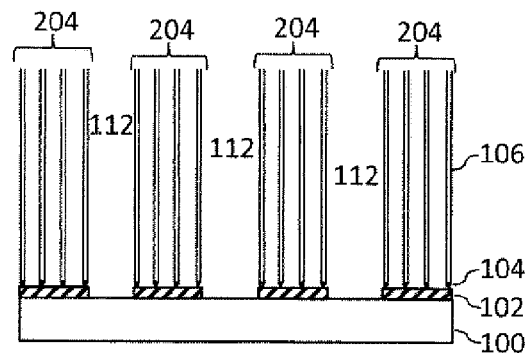

As shown in FIG. 2C, the structured catalyst system leads to a structured or patterned growth of nanotubes 106, whereas in the case of the manufacturing process described with respect to FIGS. 1A to 1H the catalyst system is unstructured such that the growth of nanotubes 106 thereon is not structured or patterned considering their lateral distribution on the substrate 100. The growth of nanotubes in that case considering their spatial distribution on the substrate 100 is uniform and therefore not revealing any patterns. In FIG. 2C the nanotubes 106 are arranged in groups 204, wherein each group 204 is grown on a catalyst system portion 200. As mentioned above, nanotubes may be also transferred onto a structured undercoating layer from a different substrate where they have been grown instead of being grown on the catalyst system of the substrate 100 to obtain the structure shown in FIG. 2C. The previously formed gaps 202 in the catalyst system including the first layer 102 and the second layer 104 may define the position and the cross-sectional area of the bottom surface of the trenches 112.

Figure 2D:
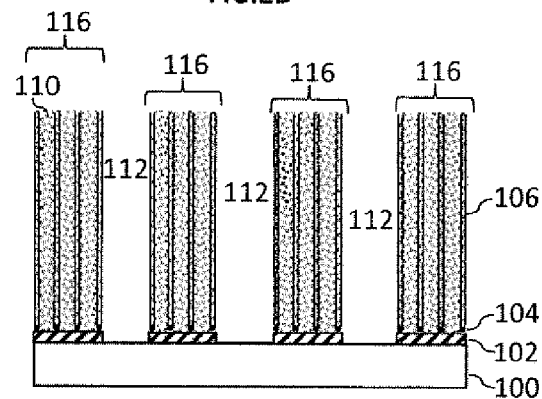

In a further process step, the insulating material 110 is deposited over the substrate 100 such that it may settle between the nanotubes 106 within each of the insulator-nanotube composite portions 116. The insulating material 110 may be selectively deposited on and around the nanotubes 106 from a gas phase as they will act as nucleation sites for oxide deposition from the gas phase. However, a thin layer of insulating material 106 with a thickness of a few nanometers may be deposited within the trenches 112 which may have to be etched away after the depositing process The resulting structure is shown in FIG. 2D which corresponds to the structure as shown in FIG. 1E. Therefore, comparing the two embodiments of the method for manufacturing a metallization layer on a substrate as described above, the catalyst system may be structured beforehand such that the nanotubes 106 are grown or are arranged on the substrate 100 in a patterned or structured manner in form of insulator-nanotube composite portions, or the catalyst system may remain unstructured which necessitates etching of the insulator-nanotube composite 116 to obtain the same patterned structure of insulator-nanotube composite portions. Further process steps as described with reference to FIGS. 1F to 1H may performed on the structure shown in FIG. 2D.

The advantage of both embodiments of the manufacturing process leading to a (structured) metallization layer on the substrate 100 as described with reference to FIGS. 1A to 1H and FIGS. 2A to 2D may be seen in the easy structuring of the nanotube forest 108. The simple structuring of the catalyst system before growing or transferring the nanotubes 106 onto the substrate 100 may be used to form complicated trench patterns while the desired height of the nanotube forest or block portions thereof is linearly dependent on its growth time. Thus, the height H of metal 114 portions as shown in FIG. 1H may be adjusted from a few micrometers up to a few to millimeters.

It is to be pointed out that the deposition of the insulating material 110 onto and between the nanotubes 106 is an optional step. The two described embodiments of the method for manufacturing a metallization layer on a substrate may be executed without employing the insulating material 106 in the process and hence omitting the instantaneous embodiments shown in FIGS. 1E and 2D. The ensuing etching of the insulator-nanotube composite 116 (see FIG. 1F) is then replaced by the etching of the forest of nanotubes 106 into separate portions or groups of nanotubes. In other words, the presence of the insulating material 110 does not affect the etching of the forest of nanotubes 108 into portions or groups of nanotubes or the functionality of the groups of nanotubes 106 as forming material in order to provide the trenches 112 into which metal 114 is filled into. However, if the insulating material 110 is left out from the manufacturing process and the nanotubes/nanowires are electrically conductive, then they may be seen as sacrificial structures which may need to be removed in order to avoid short circuits between the individual portions of metal 114. If the insulating material 110 is deposited at least between the nanotubes to form the insulator-nanotube composite 116, the individual portions thereof may remain in place, as the insulating material 110 renders those portions of insulator-nanotube composite electrically nonconducting.

Figure 3:
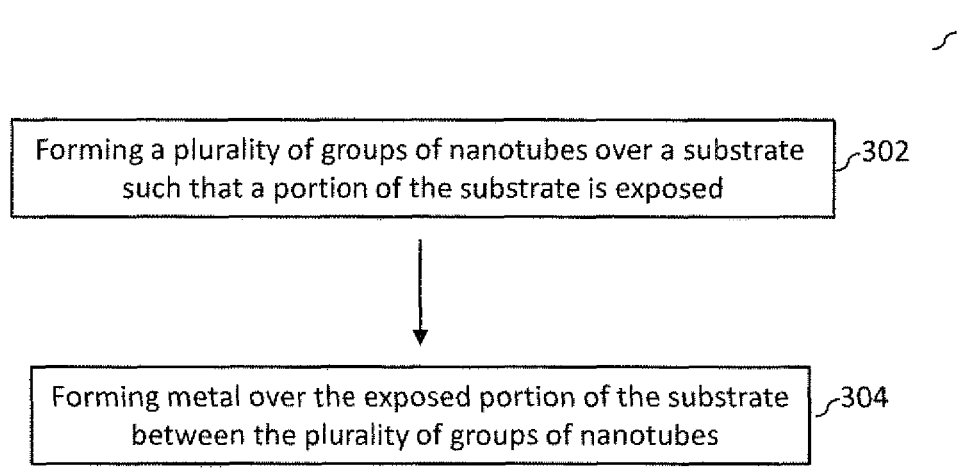
FIG. 3 shows a flow chart describing the process flow of the method for manufacturing a metallization layer on a substrate according to various further embodiments.

In FIG. 3 a flow chart 300 is shown describing the process flow of the method for manufacturing a metallization layer on a substrate according to various further embodiments. In a first step 302, a plurality of groups of nanotubes may be formed over a substrate, wherein the plurality of groups of nanotubes are arranged such that a portion of the substrate is exposed. In a second step 304, metal may be formed over the exposed portion of the substrate or filled into a trench formed between the plurality of groups of nanotubes. The method as described based on the flow chart 300 may include further steps in accordance with the aspects described above with reference to FIGS. 1A to 1H and 2A to 2D.

Figure 4:
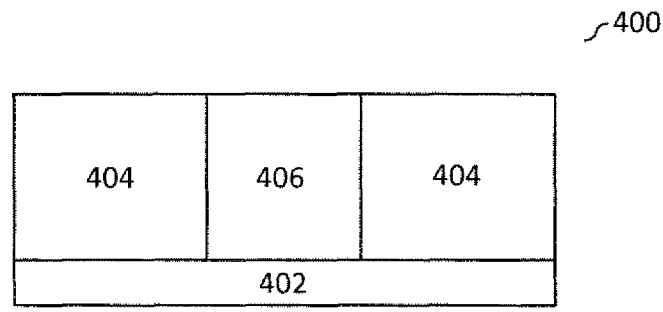
FIG. 4 shows a semiconductor device according to various embodiments.

In FIG. 4 a semiconductor device 400 according to various embodiments is shown. The semiconductor device 400 according to various embodiments may include a substrate 402. Over the substrate 402, a plurality of groups 404 of nanotubes may be arranged plurality of groups of nanotubes arranged over the substrate 402 and metal 406 may be formed over the substrate 402 between the plurality of groups of nanotubes. The semiconductor device 400 according to various embodiments may include further features in accordance with the aspects described above with reference to FIGS. 1A to 1H and 2A to 2D.

In accordance with various embodiments a method for manufacturing a metallization layer on a substrate is provided, wherein the method may include forming a plurality of groups of nanotubes over a substrate, wherein the groups of nanotubes are arranged such that a portion of the substrate is exposed and forming metal over the exposed portion of the substrate between the plurality of groups of nanotubes.

According to further embodiments of the method, each group of nanotubes may include insulating material between the nanotubes.

According to further embodiments of the method forming the plurality of groups of nanotubes over a substrate may include depositing a catalyst material on the substrate.

According to further embodiments of the method, the catalyst material may include a first layer of material, the material being one of aluminium, tantalum, nickel, titanium, chromium, iron or its alloys (such as Fe—Ni and Fe—Mo, for example) and tungsten.

According to further embodiments of the method the catalyst material may include a second layer of material provided over the first layer of material, the material of the second layer being one of iron, cobalt and nickel.

According to further embodiments of the method forming the plurality of groups of nanotubes over a substrate may include removing a multitude of nanotubes together with insulating material deposited therebetween from a uniform arrangement of nanotubes with insulating material deposited therebetween.

According to further embodiments the method may further include growing a uniform arrangement of nanotubes on the surface of the catalyst material.

According to further embodiments the method may further include forming an adhesion promoting layer on the substrate; and transferring fully grown nanotubes from another substrate onto the adhesion promoting layer.

According to further embodiments the method may further include removing the catalyst material from underneath the multitude of nanotubes which have been removed together with insulating material deposited therebetween.

According to further embodiments of the method the plurality of groups of nanotubes may include carbon nanotubes.

According to further embodiments of the method removing the multitude of nanotubes together with insulating material deposited therebetween may include a plasma etch process.

According to further embodiments of the method the forming of the plurality of groups of nanotubes over a substrate may include depositing a structured layer of catalyst material on the substrate.

According to further embodiments the method may further include growing a uniform arrangement of nanotubes on the surface of the structured layer of catalyst material.

According to further embodiments the method may further include structuring the adhesion promoting layer; and transferring fully grown nanotubes from another substrate onto the structured adhesion promoting layer.

According to further embodiments of the method the nanotubes in the plurality of groups of nanotubes arranged over the substrate are substantially extending at right angle with respect to the substrate.

In accordance with various embodiments a semiconductor device is provided, wherein the semiconductor device may include a substrate; a plurality of groups of nanotubes which may be arranged over the substrate such that a portion of the substrate is exposed; and metal which may be formed over the exposed portion of the substrate between the plurality of groups of nanotubes.

According to further embodiments of the semiconductor device each group of nanotubes may include insulating material between the nanotubes.

According to further embodiments of the semiconductor device the plurality of groups of nanotubes may include carbon nanotubes. In various embodiments, the term nanotubes may encompass any other 1D structures such as nanowires, nanofibers, nanotubes, microwires, microfibers and microtubes.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for manufacturing a metallization layer on a substrate, the method comprising:
depositing a catalyst material on the substrate, the catalyst material comprising a first layer of material arranged over the substrate and a second layer of material arranged over the first layer of material;
forming a plurality of groups of nanotubes over the substrate so that one or more trenches are formed between the groups of nanotubes, wherein each of the one or more trenches exposes a respective portion of the substrate between the groups of nanotubes, wherein the deposited catalyst material facilitates formation of the plurality of groups of nanotubes, and wherein each of the plurality of groups of nanotubes comprises a plurality of nanotubes and insulating material between the nanotubes;
forming metal in the one or more trenches between the groups of nanotubes over the one or more exposed portions of the substrate, wherein the metal completely fills the one or more trenches, wherein the first layer of material comprises one of aluminium, tantalum, chromium and tungsten, and wherein the second layer of material comprises one of iron, cobalt and nickel.

2. The method of claim 1,
wherein forming the plurality of groups of nanotubes over the substrate comprises:
providing a uniform arrangement of nanotubes;
depositing an insulating material therebetween;
removing a multitude of nanotubes together with the insulating material deposited therebetween.

3. The method of claim 1, further comprising:
growing a uniform arrangement of nanotubes on a surface of the catalyst material.

4. The method of claim 2, further comprising:
removing the catalyst material from underneath the multitude of nanotubes which have been removed together with the insulating material deposited therebetween.

5. The method of claim 1,
wherein the plurality of groups of nanotubes comprise carbon nanotubes.

6. The method of claim 2,
wherein removing the multitude of nanotubes together with the insulating material deposited therebetween comprises a plasma etch process.

7. The method of claim 1,
wherein the nanotubes in the plurality of groups of nanotubes arranged over the substrate are substantially extending at a right angle with respect to the substrate.

8. The method of claim 1, further comprising:
after forming the metal over the at least one exposed portion of the substrate, removing each of the plurality of groups of nanotubes.

9. The method of claim 8, further comprising:
after removing the each of the plurality of groups of nanotubes, removing the catalyst material so as to expose one or more portions of the substrate.

10. A method for manufacturing a metallization layer on a substrate, the method comprising:
depositing a catalyst material on the substrate, the catalyst material comprising a first layer of material arranged over the substrate and a second layer of material arranged over the first layer of material;
forming a plurality of groups of nanotubes over the substrate so that at least one portion of the substrate between the groups of nanotubes is exposed, wherein the deposited catalyst material facilitates formation of the plurality of groups of nanotubes, wherein each of the plurality of groups of nanotubes comprises a plurality of nanotubes with insulating material disposed between adjacent nanotubes of the plurality of nanotubes;
forming metal over the at least one exposed portion of the substrate; and
after forming the metal, removing each of the plurality of groups of nanotubes, wherein removing each of the plurality of groups of nanotubes comprises removing the plurality of nanotubes and the insulating material of each group of nanotubes.

11. The method of claim 10, further comprising:
after removing each of the plurality of groups of nanotubes, removing the catalyst material.

12. The method of claim 10, wherein the plurality of groups of nanotubes are formed so that at least one or more trenches are formed between the groups of nanotubes, wherein each of the one or more trenches exposes a respective portion of the substrate between the groups of nanotubes, and
wherein the metal completely fills the one or more trenches.

* * * * *